US007777254B2

(12) United States Patent
Sato

(10) Patent No.: US 7,777,254 B2
(45) Date of Patent: Aug. 17, 2010

(54) NORMALLY-OFF FIELD-EFFECT SEMICONDUCTOR DEVICE

(75) Inventor: Ken Sato, Saitama (JP)

(73) Assignee: Sanken Electric Co., Ltd. (JP)

(*) Notice: Subject to any disclaimer, the term of this patent is extended or adjusted under 35 U.S.C. 154(b) by 0 days.

(21) Appl. No.: 12/135,417

(22) Filed: Jun. 9, 2008

(65) Prior Publication Data

US 2008/0303064 A1 Dec. 11, 2008

(30) Foreign Application Priority Data

Jun. 11, 2007 (JP) .............................. 2007-154156

(51) Int. Cl.
*H01L 29/739* (2006.01)
*H01L 31/0328* (2006.01)
*H01L 31/0336* (2006.01)
*H01L 31/072* (2006.01)
*H01L 31/109* (2006.01)

(52) U.S. Cl. ............... 257/194; 257/195; 257/E29.246; 257/E29.247; 257/E29.248; 257/E29.249; 257/E29.25; 257/E29.251; 257/E29.252; 257/E29.253; 257/E29.254

(58) Field of Classification Search ......... 257/194–195, 257/E29.246, E29.247, E29.248, E29.249, 257/E29.25, E29.251, E29.252, E29.253, 257/E29.254
See application file for complete search history.

(56) References Cited

U.S. PATENT DOCUMENTS

| 5,047,811 | A | * | 9/1991 | Miyano | 257/280 |
| 5,326,995 | A | * | 7/1994 | Ohori | 257/194 |
| 5,371,388 | A | * | 12/1994 | Oda | 257/194 |
| 6,452,221 | B1 | * | 9/2002 | Lai et al. | 257/192 |
| 6,498,360 | B1 | * | 12/2002 | Jain et al. | 257/194 |
| 7,339,206 | B2 | * | 3/2008 | Akamatsu et al. | 257/192 |
| 7,388,236 | B2 | * | 6/2008 | Wu et al. | 257/194 |
| 7,408,182 | B1 | * | 8/2008 | Smart et al. | 257/13 |
| 7,501,670 | B2 | * | 3/2009 | Murphy | 257/194 |
| 2006/0214187 | A1 | * | 9/2006 | Mita et al. | 257/194 |
| 2007/0007547 | A1 | * | 1/2007 | Beach | 257/201 |
| 2007/0051978 | A1 | * | 3/2007 | Mita et al. | 257/194 |
| 2007/0051979 | A1 | * | 3/2007 | Kambayashi et al. | 257/194 |
| 2007/0268071 | A1 | * | 11/2007 | Pribble et al. | 330/251 |
| 2008/0006845 | A1 | * | 1/2008 | Derluyn et al. | 257/192 |

(Continued)

FOREIGN PATENT DOCUMENTS

JP 08203930 8/1996

(Continued)

*Primary Examiner*—Ida M Soward
(74) *Attorney, Agent, or Firm*—Woodcock Washburn LLP

(57) ABSTRACT

After creating an electron transit layer on a substrate, a baffle is formed on midpart of the surface of the electron transit layer, the surface having a pair of spaced-apart parts left on both sides of the baffle. A semiconducting material different from that of the electron transit layer is deposited on its surface thereby conjointly fabricating an electron supply layer grown continuously on the pair of spaced-apart parts of the electron transit layer surface, and a discontinuous growth layer on the baffle in the midpart of the electron transit layer surface. When no voltage is being impressed to the gate electrode on the discontinuous growth layer, this layer creates a hiatus in the two-dimensional electron gas layer generated along the heterojunction between the electron supply layer and electron transit layer. The hiatus is closed upon voltage application to the gate electrode.

6 Claims, 3 Drawing Sheets

U.S. PATENT DOCUMENTS

| | | | |
|---|---|---|---|
| 2008/0067523 A1* | 3/2008 | Dwilinski et al. | 257/76 |
| 2008/0087917 A1* | 4/2008 | Briere | 257/194 |
| 2008/0296618 A1* | 12/2008 | Suh et al. | 257/190 |
| 2008/0308813 A1* | 12/2008 | Suh et al. | 257/76 |
| 2009/0008677 A1* | 1/2009 | Kikkawa | 257/194 |

FOREIGN PATENT DOCUMENTS

| | | | |
|---|---|---|---|
| JP | 2001127282 A | * | 5/2001 |
| JP | 2005183733 | | 7/2005 |

* cited by examiner

NORMALLY-OFF FIELD-EFFECT SEMICONDUCTOR DEVICE

CROSS REFERENCE TO RELATED APPLICATIONS

This application claims priority to Japanese Patent Application No. 2007-154156, filed Jun. 11, 2007.

BACKGROUND OF THE INVENTION

This invention relates generally to semiconductor devices, particularly to field-effect semiconductor devices as typified by high electron mobility transistors (HEMTs), and more particularly to such devices that are normally off. The invention also pertains to a method of making such normally-off field-effect semiconductor devices.

The HEMT of typical prior art design comprises an electron transit layer of undoped gallium nitride (GaN) grown on a substrate of silicon, sapphire or the like via a buffer, an electron supply, or barrier, layer of n-doped or undoped aluminum gallium nitride (AlGaN) on the electron transit layer, and a source, drain, and gate (Schottkey) electrode on the electron supply layer. The AlGaN electron supply layer has a greater bandgap and less lattice constant than does the GaN electron transit layer.

Overlying the electron transit layer of a greater lattice constant, the electron supply layer experiences an expansive strain (tensile stress) and so gives rise to piezoelectric depolarization. The AlGaN electron supply layer is also subject to spontaneous depolarization. Consequently, what is known as a two-dimensional electron gas layer is created in the electron transit layer adjacent its heterojunction with the electron supply layer. The two-dimensional electron gas layer provides a path, usually referred to as a channel, of current flow between the source and drain electrodes. The source-drain current flow is controllable by a bias voltage impressed to the gate electrode.

The HEMT of the foregoing general prior art construction was normally on, there having been a source-drain current flow while no voltage was being applied to the gate electrode. It had to be turned off using a negative power supply for causing the gate electrode to gain a negative potential. Use of such a negative power supply made the associated electric circuitry unnecessary complex and expensive. The conventional normally-on HEMT was therefore rather inconvenient of use.

Attempts have been made to devise a HEMT that is normally off. One known approach to that end was to make the AlGaN electron supply layer thinner. A thinner electron supply layer weakens the field of the electron supply layer due to piezoelectric and spontaneous depolarizations, resulting in the diminution of electron concentration in the two-dimensional electron gas layer. The two-dimensional electron gas layer disappears at its part just under the gate when a field due to the potential difference, (built-in potential) between the electron supply layer and, making Schottky contact therewith, the gate electrode acts upon the two-dimensional electron gas layer of reduced electron concentration. The HEMT can thus be held off between the source and drain electrodes without application of a bias voltage to the gate.

However, the normally-off HEMT based upon this conventional scheme proved to possess the drawback that, by reason of the thin electron supply layer itself, the two-dimensional electron supply layer suffers an unnecessary drop in electron concentration at other than right below the gate as well. The result was an inconveniently high source-drain turn-on resistance.

A solution to this inconvenience is found in Japanese Unexamined Patent Publication No. 2005-183733. It teaches to make the electron supply layer thinner only at its part underlying the gate by creating a recess in that layer. This solution proved unsatisfactory in that the creation of the recess by selective etching of the electron supply layer might lead to the impairment of the crystalline structure of the electron supply layer, as well as that of the electron transit layer, and hence to the deterioration of the electrical characteristics of the HEMT. What is worse, in desired mass production of the normally-off HEMTs, their threshold voltage would fluctuate from one device to another if, as is very likely to occur, their electron supply layers were not etched to an exactly unvarying depth. For these reasons, as far as the applicant is aware, there seem to be no normally-off HEMTs of the above known scheme that have been currently available on the market.

Japanese Examined Patent Publication No. 8-264760 makes a different approach to a normally-off HEMT. It suggests to make that part of the electron supply layer which underlies the gate electrode higher in resistance by ion implantation. The resulting device is normally off as the heterojunction between the electron supply layer and electron transit layer normally disappears from under the gate electrode. The device turns on upon voltage application to the gate electrode because then the channel is completed by virtue of the field effect through the electron transit layer including its part under the gate electrode. This prior art device is also objectionable by reason of difficulties in invariably creating the high resistance part of the electron supply layer under the gate electrode.

SUMMARY OF THE INVENTION

The present invention has it as an object to render HEMTs or like field-effect semiconductor devices of the kind defined, capable of normally-off operation.

Another object of the invention is to reduce the performance characteristics of such normally-off field-effect semiconductor devices to an absolute minimum.

Still another object of the invention is to provide a method of most efficiently fabricating such normally-off field-effect semiconductor devices.

Briefly stated in one aspect thereof, the present invention concerns a field-effect semiconductor device comprising a first semiconductor layer of a first semiconducting material having a major surface comprised of a pair of spaced-apart parts with a midpart therebetween. A baffle is formed on the midpart of the surface of the first semiconductor layer. Formed on the entire major surface of the first semiconductor layer is a deposit of a second semiconducting material which includes a second semiconductor layer grown continuously on the pair of spaced-apart parts of the major surface and a discontinuous growth layer grown discontinuously on the midpart of the major surface via the baffle. The second semiconductor layer creates a two-dimensional carrier gas layer in the first semiconductor layer whereas the discontinuous growth layer creates, normally, a hiatus in the two-dimensional carrier gas layer. Also included are a source electrode and a drain electrode which are both electrically coupled to the two-dimensional carrier gas layer in the first semiconductor layer and normally held electrically disconnected from each other by the hiatus in the two-dimensional carrier gas layer. A gate electrode is formed on the discontinuous growth layer for closing the hiatus in the two-dimensional carrier gas layer.

Thus the device is normally off between the source and drain electrodes as the discontinuous growth layer causes a discontinuity in the two-dimensional carrier gas layer therebetween. The device turns on upon voltage application to the gate electrode because then the discontinuity is eliminated from the two-dimensional carrier gas layer.

The discontinuous growth layer as well as the underlying baffle generates little or no field similar to that due to the spontaneous or piezoelectric depolarization of the second semiconductor layer (e.g., electron supply layer). Hence, normally, the break in the two-dimensional carrier gas layer under the gate electrode, interrupting source-drain conduction. There is thus obtained a normally-off field-effect semiconductor device by the extremely simple, easy-to-fabricate means of the baffle and the discontinuous growth layer thereon.

A further strength of the invention arises from the fact that the threshold voltage of the device depends upon the thickness of the baffle plus that of the discontinuous grown layer thereon. The threshold voltage is therefore more easily controllable, and its fluctuations from one device to another more easily eliminable, than in the prior art normally-off devices relying on the recess in the second semiconductor layer or on the high resistance region in that layer.

In a preferred embodiment of the invention the baffle is made from an insulator. This fact, combined with the fact that the discontinuous growth layer is higher in resistivity than the second semiconductor layer, reduces gate leak current to a minimum.

Another aspect of the invention concerns a method of fabricating the normally-off field-effect semiconductor device of the above summarized construction. The method involves the deposition of the second semiconducting material on the major surface of the first semiconductor layer thereby conjointly creating the second semiconductor layer and the discontinuous growth layer thereon. The second semiconductor layer is grown continuously on the pair of spaced-apart parts of the major surface of the first semiconductor layer for creating a two-dimensional carrier gas layer in the first semiconductor layer. The discontinuous growth layer on the other hand is grown discontinuously on the midpart of the major surface of the first semiconductor layer via the baffle for normally creating the required hiatus in the two-dimensional carrier gas layer in the first semiconductor layer.

The conjoint fabrication of the second semiconductor layer and the continuous growth layer not only expedites the fabrication of the device but also makes their surfaces smoother and flush with each other, with little or no steps therebetween. The source, drain and gate electrodes may then be fabricated on these surfaces to very close dimensional and positional tolerances.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

Figure 1:
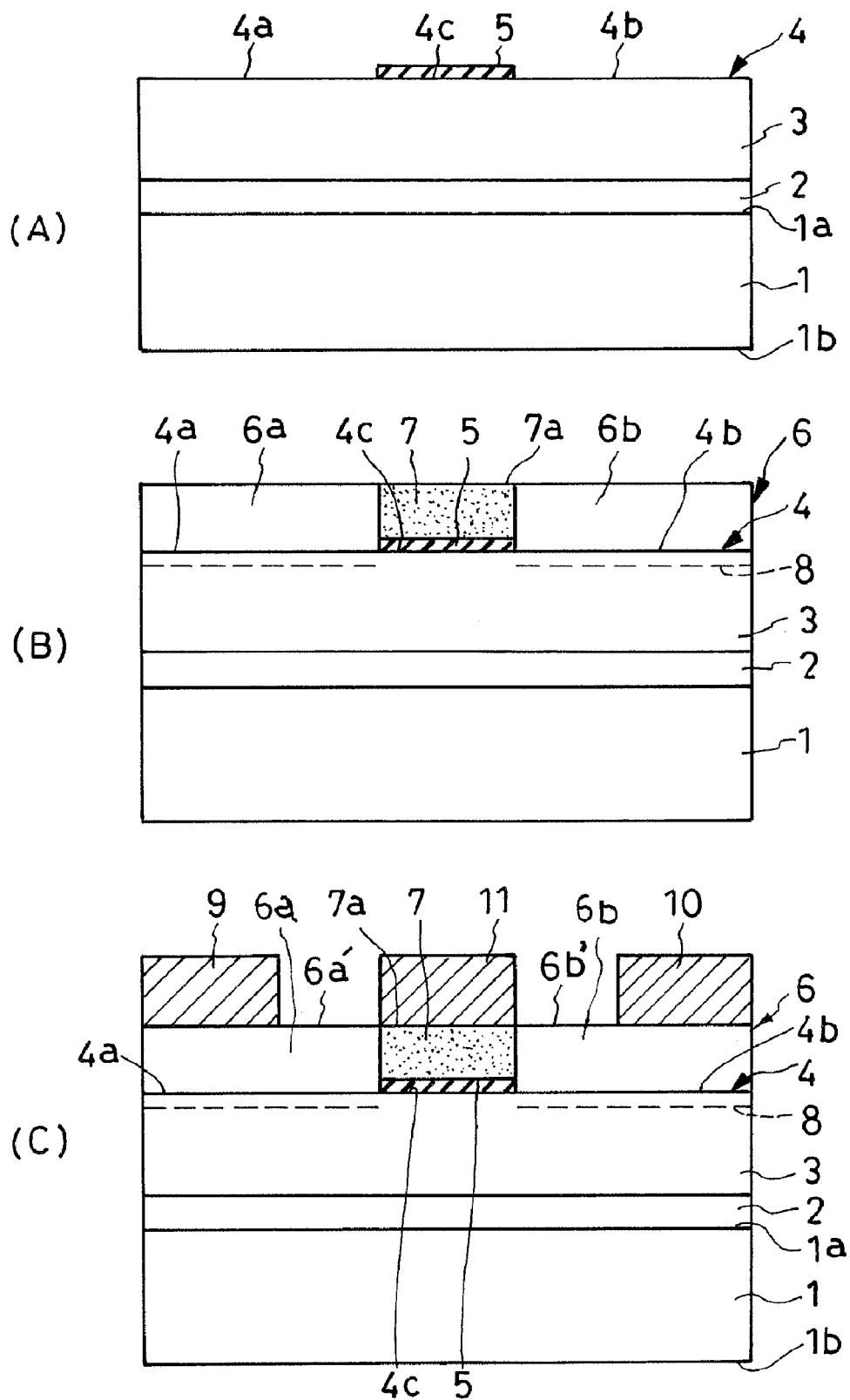
FIG. 1, consisting of (A) to (B), is a series of schematic sectional views showing sequential steps of fabricating a preferred form of normally-off HEMT-type field-effect semiconductor device according to the novel principles of the present invention.

The present invention will now be described more specifically in terms of some representative HEMT-type field-effect semiconductor devices shown in the drawings above. The "HEMT-type field effect semiconductor device" is so named tentatively in this application because it differs in some respects from what is now generally known as the HEMT, but is akin thereto in operating principle. So the device proposed hereby will be referred to as "HEMT-type field-effect semiconductor device," or simply as "HEMT-type semiconductor device," or more simply as "HEMT-type device," or even more simply as "device."

FIG. 1 indicates at (A), (B) and (C) the successive steps in the fabrication of a first preferred form of HEMT-type field-effect semiconductor device according to the invention. The device is shown completed at (C). The construction of the device will become apparent in the course of the following description of the exemplary method of fabricating the same.

With reference first to FIG. 1(A) the manufacture of the device starts with the preparation of a substrate 1 having a pair of opposite major surfaces $1_a$ and $1_b$. The substrate 1 serves both as a basis for epitaxially growing thereon semiconductor layers to be set forth subsequently and as a mechanical support for all such layers. The substrate is made from silicon for economy in this particular embodiment, but also adoptable are other materials including semiconductors such as silicon carbide and gallium nitride, and insulators such as sapphire and ceramics. As required, moreover, a semiconductor substrate might be employed which was rendered electroconductive by doping.

A buffer region 2 is first grown in vapor phase on the surface $1_a$ of the substrate 1 by any known or suitable method such as metalorganic chemical vapor deposition (MOCVD) also referred to as metalorganic vapor phase epitaxy (MOVPE). In practice the buffer region 2 may be either mono- or multi-layered. The multilayer option may comprise, for example, a desired number of alternations of an aluminum nitride (AlN) layer and a gallium nitride (GaN) layer. Other Groups III-V compound semiconductors may be used in lieu of AlN and GaN. Being not too closely associated with the operation of the HEMT-type field-effect semiconductor device, however, the buffer region 2 is omissible.

Then, as shown also at (A) in FIG. 1, an electron transit layer 3 as the first semiconductor layer is epitaxially grown on the buffer region 2 by any such known method as MOCVD. The electron transit layer 3 may be made from undoped GaN to a thickness of, say, 1-5 micrometers. Broadly, the electron transit layer 3 may be made from nitride semiconductors containing gallium and nitride. More specifically, such nitride semiconductors are generally definable as:

$$Al_a In_b Ga_{1-a-b} N$$

where the subscripts a and b are both numerals that are equal to or greater than zero and less than one, and the sum of a and b is also equal to or greater than zero and less than one.

Then, with continued reference to FIG. 1(A), a baffle 5 is formed on midpart $4_c$ of the exposed major surface 4 of the electron transit layer 3. The midpart $4_c$ of the major surface 4 of the electron transit layer 3 is such that this surface is thereby divided into a pair of spaced-apart parts $4_a$ and $4_b$ to be later referred to in more detail. As will become better understood from the following description, the baffle 5 is intended to prevent the electron supply layer 6, FIGS. 1(A) and (B), from growing thereon in coherence, or in lattice alignment, or in a single crystal, with the underlying part of the electron transit layer 3 according to the novel concepts of the instant invention.

The baffle 5 is of electrically insulating material composed of silica ($SiO_2$) in this particular embodiment. More broadly, it may be made from silicon oxides generally expressed as $SiO_x$ (where x is a numeral 1-2), or from silicon nitrides (insulators) such as $Si_3N_4$, $SiN_x$ (where x is an arbitrary numeral), SiN and $Si_2N_3$, or from aluminum oxides (insulators) generally expressed as $AlO_x$ (where x is an arbitrary numeral), or from polycrystalline aluminum nitride (semiconducting nitride) which is formed in the process of low temperature epitaxial growth.

A preferred method of creating the baffle 5 involves the formation, as by CVD, of a film of $SiO_2$ on the entire major surface 4 of the electron transit layer 3. Then the undesired parts of this $SiO_2$ film may be wet etched away using hydrofluoric acid which is highly selective between $SiO_2$ and GaN, the latter being the preferred material of the electron transit layer 3. Wet etching is recommended because it does far less harm to the crystallinity of the GaN electron transit layer 3 than dry etching does. The baffle 5 is thus obtainable with little or no deterioration in the crystallinity of the electron transit layer 3.

Next comes the step, illustrated at (B) in FIG. 1, of epitaxially growing a semiconducting material (e.g., AlGaN) different from that of the electron transit layer 3 on the pair of spaced-apart parts $4_a$ and $4_b$ of the electron transit layer surface 4 as well as on the surface of the baffle 5. MOCVD may be employed here again. The result is the conjoint fabrication of the electron supply layer 6, which is divided into two parts $6_a$ and $6_b$, and a discontinuous growth layer 7 therebetween. Deposited directly on the spaced-apart surface parts $4_a$ and $4_b$ of the electron transit layer 4, the parts $6_a$ and $6_b$ of the electron supply layer 6 are both continuous growth layers, being in lattice alignment with the electron transit layer 4 and good in crystallinity.

The discontinuous growth layer 7 on the other hand is amorphous, having been grown on the baffle 5. This layer 7 does not create a two-dimensional carrier (electron) gas layer in the underlying part of the electron transit layer 3 in the normal state of the device in which no voltage is impressed to the gate electrode yet to be presented. The discontinuous growth layer 7 is an essential feature of the normally-off HEMT-type semiconductor device according to the invention. It will also be apparent that the discontinuous growth layer 7 need not be amorphous as long as it serves to prevent the creation of a two-dimensional electron gas layer in the underlying part of the electron transit layer 3. Other possible types of the discontinuous growth layer 7 include one in which that layer is not grown in coherence with the electron transit layer 3, one in which that layer is out of lattice alignment with the electron transit layer 3, and one in which that layer is polycrystalline.

The two-part electron supply layer 6 as the second semiconductor layer is greater in bandgap and less in lattice constant than the electron transit layer 3. Thus the electron supply layer 6 is subject to both spontaneous and piezoelectric depolarizations. Consequently, as indicated by the dashed lines designated 8 at (B) in FIG. 1, the fields due to these depolarizations give rise to the two-dimensional electron gas layer in the electron transit layer 3 along the two spaced parts $4_a$ and $4_b$ of its surface 4. This two-dimensional electron gas layer 8 is normally split by the hiatus, or lack of sufficient electron concentration to provide a current path, caused as above by the discontinuous growth layer 7.

A pronounced feature of the method of this invention is the concurrent creation of the two-part electron supply layer 6 and discontinuous growth layer 7 by the growth of AlGaN or like semiconductor which is greater in bandgap and less in lattice constant than the material of the electron transit layer 3.

The electron supply layer 6 together with the discontinuous growth layer 7 is made from semiconducting nitrides containing aluminum, gallium and nitride. These semiconducting nitrides are generally defined by the formula:

where the subscript a is a numeral that is greater than zero and less than one, greater than a in the formula above defining the materials for the electron transit layer 3, preferably in the range of 0.2 through 0.4, and most desirably 0.3; or by the formula:

where the subscript a is a numeral that is greater than zero and less than one, and greater than a in the formula above defining the materials for the electron transit layer 3; the subscript b is a numeral that is equal to or greater than zero and less than one; and the sum of a and b is greater than zero and less than one; or by the formula:

where the subscript b is a numeral that is greater than zero and less than one. The particular substance used in this embodiment of the invention is $Al_{0.3}Ga_{0.7}N$.

It is unessential that the electron supply layer 6 and discontinuous growth layer 7 be made from an undoped semiconducting nitride. These layers 6 and 7 might be made from some n-doped semiconducting nitride or other compound semiconductor. The joint growth of the layers 6 and 7 offers the additional advantage that the surfaces $6_a'$ and $6_b'$ of the two spaced parts $6_a$ and $6_b$ of the electron supply layer 6 are formed exactly flush with the surface $7_a$ of the discontinuous growth layer 7.

At (C) in FIG. 1 is depicted the next step, the fabrication of a source electrode 9 and drain electrode 10 on the surfaces $6_a'$ and $6_b'$ of the two spaced parts $6_a$ and $6_b$ of the electron supply layer 6 and of a gate electrode 11 on the surface $7_a$ of the discontinuous growth layer 7. These electrodes 9-11 may be formed by first depositing titanium in vapor phase on the complete surfaces $6_a'$, $6_b'$ and $7_a$ to a thickness of, say, 25 nanometers, then aluminum on the entire titanium deposit to a thickness of, say, 500 nanometers, then photolithographically patterning the laminated titanium and aluminum layers into the desired electrodes 9-11. Alternatively, the electrodes 9-11 may be made from other metals capable of low-resistance (ohmic) contact with the underlying layers 6 and 7. The gate electrode 11 may be made solely from aluminum or from electroconductive polysilicon or like semiconductors. The source electrode 9 and drain electrode 10 are both coupled to the two-dimensional electron gas layer 8 via the extremely thin electron supply layer 6. That is, the source electrode 9 is coupled to the two-dimensional electron gas layer 8 in the electron transit layer 3 along the part $4_a$ of the surface 4 of the electron transit layer 3, and the drain electrode 10 is coupled to the two-dimensional electron gas layer 8 in the electron transit layer 3 along the part $4_b$ of the surface 4 of the electron transit layer 3.

In the operation of the HEMT-type field-effect semiconductor device constructed as at (C) in FIG. 1, the two-dimensional electron gas layer 8 is not completed in the electron transit layer 3 from source electrode 9 to drain electrode 10 when no voltage is being impressed to the gate electrode 11. This interruption of the two-dimensional electron gas layer 8 occurs as the discontinuous growth layer 7 creates a gap, or a zone lacking sufficient electron density to provide a current path, in the underlying part of the two-dimensional electron gas layer. No source-drain current flow takes place even if the drain electrode 10 is higher in potential than the source electrode 9. The device is normally off.

A channel is created in the electron transit layer 3 just under the discontinuous growth layer 7 upon application of a voltage in excess of a predefined threshold between the gate electrode 11 and source electrode 9. The device turns on. Upon application of a required voltage to the gate electrode 11, and by making the drain electrode 10 higher in potential than the source electrode 9, a current will flow along the path comprising the source electrode 9, electron supply layer 6, two-dimensional electron gas layer 8, electron supply layer 6, and drain electrode 10.

The advantages won by this embodiment of the invention over the prior art assessed earlier in this specification may be recapitulated as follows:

1. The baffle 5 and discontinuous growth layer 7 do not generate a field similar to that due to the polarization of the electron supply layer 6. The two-dimensional electron gas layer 8 is therefore normally interrupted under the gate electrode 11 as at (B) in FIG. 1. Thus a normally-off HEMT-like semiconductor device is obtainable by the simple expedient of the baffle 5 and discontinuous growth layer 7.

2. It is the thicknesses of the baffle 5 and discontinuous growth layer 7 that determine the threshold voltage of the device. The threshold voltage is therefore more easily controllable and less subject to fluctuation than in the noted prior art normally-off devices relying on a recess, or on a zone of high resistance, in the electron supply layer under the gate electrode.

3. The surfaces of the electron supply layer 6 and discontinuous growth layer 7 can be formed in practically coplanar relationship to each other, so that the electrodes 9, 10 and 11 can be fabricated to close tolerances on these surfaces as at (C) in FIG. 1.

4. Gate leak current is minimized because the baffle 5 is made from an insulator and the discontinuous growth layer 7 is higher in resistivity than the electron supply layer 6.

Figure 2:
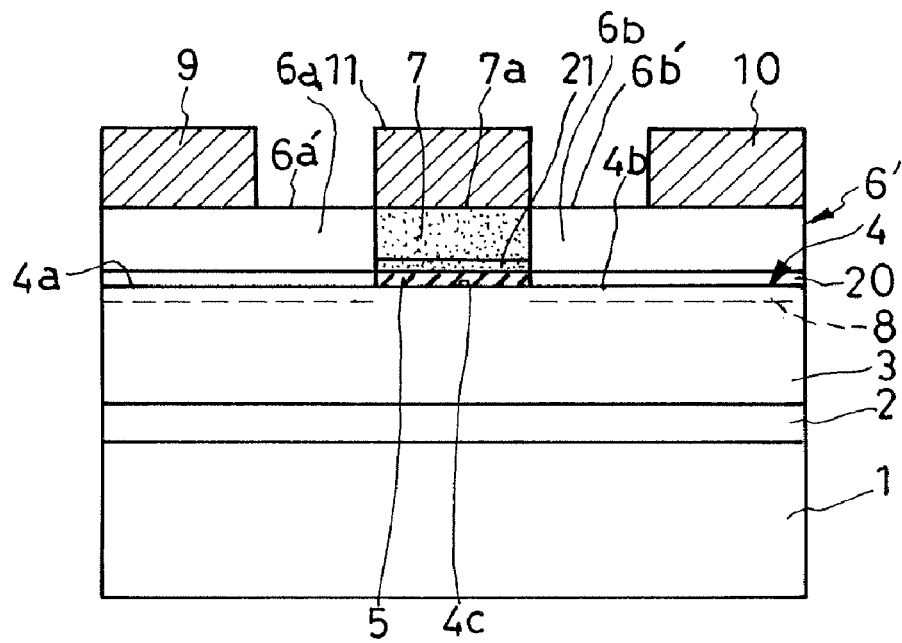
FIG. 2 is a schematic sectional view of another preferred form of normally-off HEMT-type field-effect semiconductor device according to the invention.

Embodiment of FIG. 2

The second preferred form of HEMT-like field-effect semiconductor device features a modified two-part electron supply layer 6' and a spacer 20 between the electron transit layer 3 and the modified electron supply layer 6'. All the other details of construction are substantially as set forth above with reference to FIG. 1.

The modified two-part electron supply layer 6' together with the discontinuous growth layer 7 is made from any of the n-doped semiconducting nitrides that are generally defined by the formula:

$$Al_a Ga_{1-a} N$$

where the subscript a is a numeral that is greater than zero and less than one, greater than a in the formula above defining the materials for the electron transit layer 3, preferably in the range of 0.2 through 0.4, and most desirably 0.3; or by the formula:

$$Al_a In_b Ga_{1-a-b} N$$

where the subscript a is a numeral that is greater than zero and less than one, and greater than a in the formula above defining the materials for the electron transit layer 3; the subscript b is a numeral that is equal to or greater than zero and less than one; and the sum of a and b is greater than zero and less than one; or by the formula:

$$In_b Ga_{1-b} N$$

where the subscript b is a numeral that is greater than zero and less than one. The particular substance used in this embodiment of the invention is $Al_{0.3}Ga_{0.7}N$.

Thinner than the electron supply layer 6', the spacer 20 is lattice aligned with the underlying electron transit layer 3, and so is the overlying electron supply layer 6 with the spacer 20. The spacer 20 is made from any of the undoped semiconducting nitrides that are generally defined by the formula:

$$Al_a In_b Ga_{1-a-b} N$$

where the subscript a is a numeral that is greater than zero and equal to or less than one and greater than a in the formula above defining the materials for the electron transit layer 3, and the subscript b is a numeral that is equal to or greater than zero and less than one; or by the formula:

$$In_b Ga_{1-b} N$$

where the subscript b is a numeral that is greater than zero and less than one. The particular nitride used in this embodiment of the invention is AlN.

The spacer 20 is formed by epitaxial growth of AlN on the electron transit layer 3 after the creation of the baffle 5 in the midpart $4_c$ of its surface 4. The fabrication of the spacer 20 between the electron transit layer 3 and the two-part electron supply layer 6' is therefore concurrent with that of a thin discontinuous growth layer 21 of AlN on the baffle 5. The spacer 20 serves to prevent diffusion of impurities or elements from the electron supply layer 6' into the electron transit layer 3 thereby precluding a drop in the electron mobility of the two-dimensional electron gas layer 8.

The discontinuous growth layer 7 is formed at the same time with the two-part electron supply layer 6' as in the first disclosed embodiment, although the discontinuous growth layer 7 overlies the baffle 5 via the thin discontinuous growth layer 21 of AlN. It will nevertheless be understood that this embodiment is fundamentally akin to that of FIG. 1 and so gains like benefits.

Possibly, the spacer 20 might suffice normally to prevent the creation of a two-dimensional electron gas layer in the electron transit layer 3. In that case the baffle 5 might overlie the spacer 20.

Figure 3:
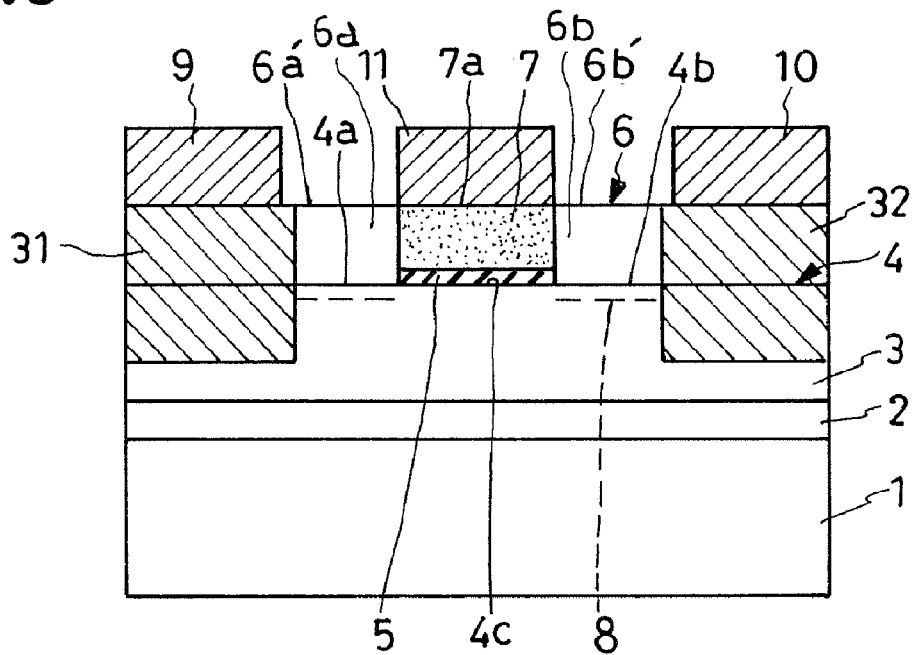
FIG. 3 is a schematic sectional view of still another preferred form of normally-off HEMT-type field-effect semiconductor device according to the invention.

Embodiment of FIG. 3

As indicated by the hatchings in FIG. 3, the electron transit layer 3 and electron supply layer 6 of this HEMT-type device have n-doped regions 31 and 32 under the source and drain electrodes 9 and 10. The n-doped regions 31 and 32 are effective to reduce the contact resistance of the electrodes 9 and 10 with the semiconductor layers 3 and 6 of the device. As required, the discontinuous growth layer 7 may be doped likewise. This embodiment is similar in all the other details of construction to that shown at (C) in FIG. 1, so that it possesses all the benefits listed in connection with the first disclosed embodiment.

Figure 4:
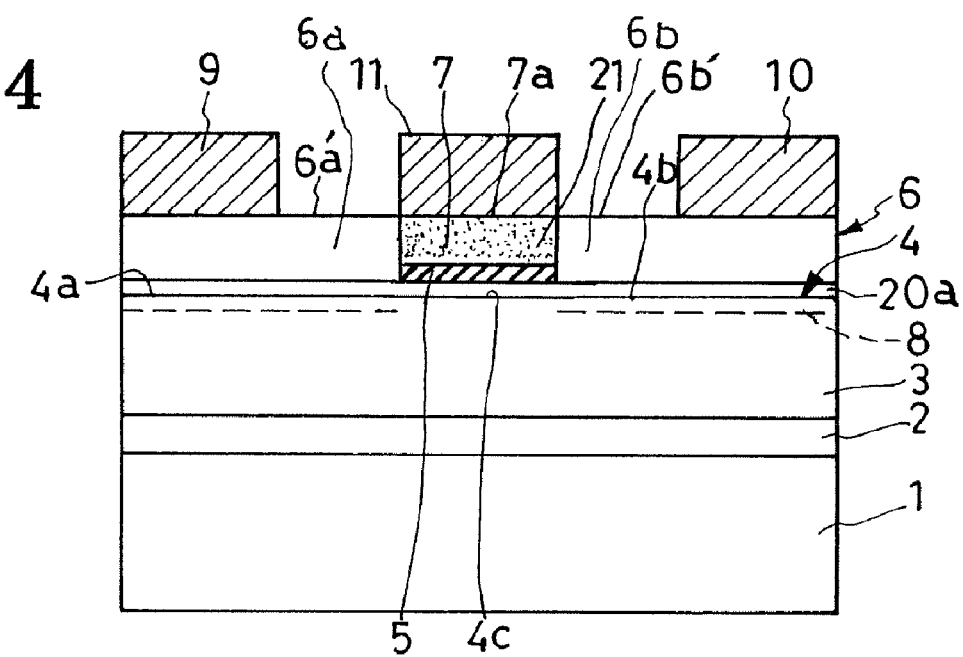
FIG. 4 is a schematic sectional view of yet another preferred form of normally-off HEMT-type field-effect semiconductor device according to the invention.

Embodiment of FIG. 4

This embodiment is similar to that of FIG. 1 except that a spacer $20_a$ is formed all over the major surface 4 of the electron transit layer 3, underlying both two-part electron supply layer 6 and baffle 5. The spacer $20_a$ is made from the same semiconducting nitride (e.g., $Al_xGa_{1-x}N$ or $Al_aIn_bGa_{1-a-b}N$) as the electron supply layer 6 and is in lattice alignment with the electron transit layer 3. The spacer $20_a$ is sufficiently thin not to create by itself a two-dimensional electron gas layer to provide a current path in that part of the electron transit layer 3 which underlies the baffle 5 in the normal state of the device.

For creating the spacer $20_a$, the required material for the electron supply layer 6 may be epitaxially grown on the complete surface 4 of the electron transit layer 3 to a prescribed depth. Then the baffle 5 may be formed on part of the thus-formed spacer $20_a$ in the manner described above in connection with FIG. 1(B). Then the same required material for the electron supply layer 6 may be epitaxially grown on the baffle 5 and on those parts of the spacer $20_a$ which are left exposed by the baffle, thereby conjointly fabricating the two-part electron supply layer 6 and discontinuous growth layer 7. The spacer $20_a$ might therefore be considered part of the electron supply layer 6.

In this embodiment, too, the two-dimensional electron gas layer 8 has normally a hiatus under the discontinuous growth layer 7, the interposed spacer $20_a$ being too thin to remove the hiatus. Thus the embodiment gains all the listed merits of that of FIG. 1.

Possible Modifications

Notwithstanding the foregoing detailed disclosure it is not desired that the present invention be limited by the exact showings of the drawings or the description thereof. The following is a brief list of possible modifications, alterations or adaptations of the illustrated representative HEMT-type field-effect semiconductor devices which are all believed to fall within the purview of the claims annexed hereto:

1. A hole supply layer of p-type semiconductor material could be substituted for the electron supply layer 6 or 6' of each illustrated embodiment, in which case a two-dimensional electron gas layer would be formed in lieu of the two-dimensional electron gas layer 8.

2. In the embodiments of FIGS. 1, 2 and 4, the electron supply layer 6 could be removed from under the source electrode 9 and drain electrode 10; that is, these electrodes could be formed directly on the electron transit layer 3.

3. Also in the embodiments of FIGS. 1, 2 and 4, the source electrodes 9 and drain electrode 10 could be placed on the electron supply layer 6 via ohmic contact layers.

4. Any one or more of a known gate field plate, source field plate, and drain field plate could be incorporated in the illustrated embodiments.

5. The electron supply layer 6 or 6' could be overlaid with a cap layer of undoped GaN, AlGaN or the like for surface charge control and other purposes.

6. A plurality of source electrodes, a plurality of drain electrodes, and a plurality of gate electrodes could be provided in each normally-off field-effect semiconductor chip according to the invention.

7. The baffle 5 and discontinuous growth layer 7 could be formed opposite part of the gate electrode 11 instead of all of it as in the illustrated embodiments.

8. The discontinuous growth layer 7 is desirably either polycrystalline or amorphous but may be monocrystalline in part or in whole. Even then the discontinuous growth layer 7 will coact with the underlying baffle 5 to give rise to a discontinuity in the two-dimensional electron gas layer in the normal state of the device.

9. The spacer $20_a$ of the FIG. 4 embodiment could be of a semiconducting material different from that of the electron supply layer 6, as is the spacer 20 of the FIG. 2 embodiment, instead of the same material as that of the electron supply layer.

What is claimed is:

1. A field-effect semiconductor device comprising:
(a) a first semiconductor layer of a first semiconducting material, the first semiconductor layer having a major surface comprised of a pair of spaced-apart parts with a midpart therebetween;
(b) a baffle formed on the midpart of the surface of the first semiconductor layer;
(c) a deposit of a second semiconducting material on the major surface of the first semiconductor layer, the deposit comprising a second semiconductor layer grown continuously on the pair of spaced-apart parts of the major surface of the first semiconductor layer for creating a two-dimensional carrier gas layer in the first semiconductor layer, and a discontinuous growth layer grown discontinuously on the midpart of the major surface of the first semiconductor layer via the baffle for normally creating a hiatus in the two-dimensional carrier gas layer in the first semiconductor layer;
(d) a source electrode electrically coupled to the two-dimensional carrier gas layer in the first semiconductor layer;
(e) a drain electrode electrically coupled to the two-dimensional carrier gas layer in the first semiconductor layer, the drain electrode being spaced from the source electrode; and
(f) a gate electrode on the discontinuous growth layer for control of conduction between the source electrode and the drain electrode,
wherein the first and the second semiconducting material are a first and a second semiconducting nitride, respectively, the second semiconducting nitride being higher in bandgap than the first, and
wherein the first semiconducting nitride contains at least gallium and nitrogen, and wherein the second semiconducting nitride contains at least gallium, nitrogen, and either of aluminum and indium.

2. A field-effect semiconductor device as defined in claim 1, wherein the baffle is made from a material selected from among an insulator, polycrystalline material, or semiconductor.

3. A field-effect semiconductor device as defined in claim 2, wherein the discontinuous growth layer of the deposit is either of a layer incoherent with the first semiconductor layer, a layer out of lattice alignment with the first semiconductor layer, a polycrystalline layer, and an amorphous layer.

4. A field-effect semiconductor device comprising:
(a) a first semiconductor layer of a first semiconducting material, the first semiconductor layer having a major surface comprised of a pair of spaced-apart parts with a midpart therebetween;
(b) a baffle formed on the midpart of the surface of the first semiconductor layer;
(c) a deposit of a second semiconducting material on the major surface of the first semiconductor layer, the deposit comprising a second semiconductor layer grown continuously on the pair of spaced-apart parts of the major surface of the first semiconductor layer for creating a two-dimensional carrier gas layer in the first semiconductor layer, and a discontinuous growth layer grown discontinuously on the midpart of the major surface of the first semiconductor layer via the baffle for normally creating a hiatus in the two-dimensional carrier gas layer in the first semiconductor layer;
(d) a source electrode electrically coupled to the two-dimensional carrier gas layer in the first semiconductor layer;
(e) a drain electrode electrically coupled to the two-dimensional carrier gas layer in the first semiconductor layer, the drain electrode being spaced from the source electrode; and
(f) a gate electrode on the discontinuous growth layer for control of conduction between the source electrode and the drain electrode,
wherein the baffle is made from a material selected from among an insulator, polycrystalline material, or semiconductor, and wherein the insulator is selected from among silicon oxide, silicon nitride, and aluminum oxide.

5. A field-effect semiconductor device comprising:
(a) a first semiconductor layer of a first semiconducting material, the first semiconductor layer having a major surface comprised of a pair of spaced-apart parts with a midpart therebetween;
(b) a baffle formed on the midpart of the surface of the first semiconductor layer;
(c) a deposit of a second semiconducting material on the major surface of the first semiconductor layer, the deposit comprising a second semiconductor layer grown continuously on the pair of spaced-apart parts of the major surface of the first semiconductor layer for creating a two-dimensional carrier gas layer grown discontinuously on the midpart of the major surface of the first semiconductor layer via the baffle for normally creating a hiatus in the two-dimensional carrier gas layer in the first semiconductor layer;
(d) a source electrode electrically coupled to the two-dimensional carrier gas layer in the first semiconductor layer;
(e) a drain electrode electrically coupled to the two-dimensional carrier gas layer in the first semiconductor layer, the drain electrode being spaced from the source electrode;
(f) a gate electrode on the discontinuous growth layer for control of conduction between the source electrode and the drain electrode; and
(g) a spacer interposed between the first and the second semiconductor layer.

6. A field-effect semiconductor device comprising:
(a) a first semiconductor layer of a first semiconducting material, the first semiconductor layer having a major surface comprised of a pair of spaced-apart parts with a midpart therebetween;
(b) a baffle formed on the midpart of the surface of the first semiconductor layer;
(c) a deposit of a second semiconducting material on the major surface of the first semiconductor layer, the deposit comprising a second semiconductor layer grown continuously on the pair of spaced-apart parts of the major surface of the first semiconductor layer for creating a two-dimensional carrier gas layer in the first semiconductor layer for creating a two-dimensional carrier gas layer in the first semiconductor layer, and a discontinuous growth layer grown discontinuously on the midpart of the major surface of the first semiconductor layer via the baffle for normally creating a hiatus in the two-dimensional carrier gas layer in the first semiconductor layer;
(d) a source electrode electrically coupled to the two-dimensional carrier gas layer in the first semiconductor layer;
(e) a drain electrode electrically coupled to the two-dimensional carrier gas layer in the first semiconductor layer, the drain electrode being spaced from the source electrode;
(f) a gate electrode on the discontinuous growth layer for control of conduction between he source electrode and the drain electrode; and
(g) a spacer interposed between the first semiconductor layer and the discontinuous growth layer.

* * * * *